United States Patent

Norioka et al.

[11] Patent Number: 5,185,530
[45] Date of Patent: Feb. 9, 1993

[54] ELECTRON BEAM INSTRUMENT

[75] Inventors: Setsuo Norioka; Hiroshi Shimada, both of Tokyo, Japan

[73] Assignee: JEOL Ltd., Tokyo, Japan

[21] Appl. No.: 786,264

[22] Filed: Nov. 1, 1991

[30] Foreign Application Priority Data

Nov. 5, 1990 [JP] Japan .................. 2-299626
Nov. 5, 1990 [JP] Japan .................. 2-321962

[51] Int. Cl.$^5$ ............................... H01J 37/09
[52] U.S. Cl. ..................... 250/398; 250/396 ML; 250/310
[58] Field of Search .......... 250/398, 396 ML, 396 R, 250/310

[56] References Cited

U.S. PATENT DOCUMENTS

| | | | |
|---|---|---|---|
| 3,243,570 | 3/1966 | Boring | 250/398 |
| 3,283,120 | 11/1966 | Spruck | 250/398 |
| 3,351,731 | 11/1967 | Tanaka | 250/398 |
| 3,652,821 | 3/1972 | Dietrich et al. | 250/398 |
| 4,961,003 | 10/1990 | Yonezawa | 250/398 |

FOREIGN PATENT DOCUMENTS 226110A 8/1985 Fed. Rep. of Germany ...... 250/398
61-59825 3/1986 Japan .

Primary Examiner—Jack I. Berman
Assistant Examiner—Kiet T. Nguyen
Attorney, Agent, or Firm—Webb, Burden, Ziesenheim & Webb

[57] ABSTRACT

A condenser means for focusing an electron beam onto a specimen and a scanning means for scanning the beam in two dimensions on the specimen placed inside a specimen chamber are disposed inside an electron beam column. The top portion of the specimem chamber is connected with the column by an annular member of a high magnetic permeability which surrounds the column. Magnetic flux passed through the top wall of the chamber is made to penetrate the annular member of a high magnetic permeability. The flux is then caused to enter the portion of the upper wall remote from the column, after which the flux leaks out. Thus, leakage of the magnetic flux into the specimem chamber is prevented.

5 Claims, 2 Drawing Sheets

ELECTRON BEAM INSTRUMENT

FIELD OF THE INVENTION

The present invention relates to an electron beam instrument such as a scanning electron microscope used for inspection of LSI (large-scale integrated) circuits.

BACKGROUND OF THE INVENTION

In an instrument using an electron beam such as a scanning electron microscope or an electron beam metrological system, an electron beam is directed to a specimen. The produced secondary electrons or backscattered electrons are detected. An image of the specimen surface is obtained from the resulting signal. When a device on which an LSI or VLSI circuit is fabricated is observed with such an instrument, metal has not yet been deposited on the specimen. Therefore, the specimen is electrically charged by the illuminating beam. To prevent this phenomenon, an electron beam accelerated at a low accelerating voltage of 0.6 to 1.2 kV is made to hit the specimen. On the other hand, a high magnification of 50,000× to 100,000× is needed, because the width of the IC pattern to be inspected or observed is less than 1 μm for LSI and VLSI circuits.

In this instrument, as the accelerating voltage decreases, the electron beam is affected more by the external magnetic field. It is known that where the accelerating voltage is varied, the effect of the magnetic field increases in inverse proportion to the square of the ratio of the accelerating voltages. For example, the effect of the magnetic field at the accelerating voltage of 25 kV is reduced by a factor of $$\sqrt{25/1}$$

as compared with the effect of the magnetic field at the accelerating voltage of 1 kV. That is, the effect of the magnetic field at the accelerating voltage of 1 kV is 5 times as large as the effect of the magnetic field at the accelerating voltage of 25 kV. Therefore, if the accelerating voltage is set to 1 kV, and if an image which is affected by the external magnetic field to the same extent as the image obtained at the accelerating voltage of 25 kV should be obtained, then it is necessary to reduce the strength of the external magnetic field by a factor of five. However, it is normally impossible to vary the external magnetic field which is an external factor. Consequently, the capability to shield the specimen against the magnetic field is required to be increased by a factor of five in order to fulfill the above requirement.

Japanese Patent Laid-Open No. 59825/1986 discloses an electron beam instrument which satisfies the above-described requirement. In particular, the housing of an electron beam exposure apparatus incorporated in the electron beam instrument is totally lined with a magnetic shield member to prevent disturbing magnetic fields from leaking into the specimen chamber. However, it follows that a sufficiently thick magnetic shield member is substantial. Hence, the cost of production of the instrument is increased greatly.

Enhancing the magnetic shielding effect by processing the steel member itself used for the production of the specimen chamber has been discussed. However, this scheme cannot be adopted for the following reason. A specimen chamber about 50 cm cube is needed to observe a wafer 8 inches in diameter from various directions, the wafer having a VLSI circuit fabricated thereon. In this case, the top surface, the bottom surface, and the four side surfaces of the specimen chamber receive a force of 1 kg per cm² from the atmosphere. Therefore, a plate 50 cm square receives a force of about 2500 kg. For this reason, it is necessary that a material having a large mechanical strength be selected as the material of each surface in order to minimize the mechanical distortion or warp of each surface of the specimen chamber. In this way, rolled steel, forged steel, or the like is employed. Even if such steel materials are used, the plate must be as thick as about 5 cm to secure a sufficient mechanical strength between vacuum and atmosphere. That is, in the above case, the wall measures 50 cm by 50 cm by 5 cm. It may be thought that the steel material machined into this size is heated above the Curie point to enhance the magnetic shielding effect of the steel material. However, large-sized heating furnace equipment is necessitated to thermally treat this large and thick steel material. In addition, the dimensions obtained by the machining are spoiled by the thermal treatment. This may make it impossible to assemble the instrument.

FIG. 3 shows a cross section of a specimen chamber made of the above-described steel material. When an external magnetic field B is applied to this chamber 1, the magnetic flux passes through the wall of the chamber 1 having a high magnetic permeability. A circular hold H is formed around the center of the ceiling of the specimen chamber to permit insertion of a column C. Under this condition, we measured the strength of the magnetic field at various locations and have found that the field is stronger at the edges surrounded by the circles in the figure. That is, the magnetic flux passed through the wall of the chamber leaks out from the edges. We also have found that this leaking flux greatly affects the electron beam between the objective lens and the specimen.

SUMMARY OF THE INVENTION

It is an object of the present invention to provide an electron beam instrument which is economical to fabricate, prevents leakage of magnetic flux into the specimen chamber, and can prevent unwanted deflection of the electron beam impinging on a specimen.

The above object is achieved by an electron beam instrument having an electron beam source, a condenser lens for focusing the electron beam emitted from the electron beam source, a column that houses both beam source and condenser lens, and a specimen chamber in which a specimen illuminated with the electron beam is placed and on which the column is placed. The instrument comprises an annular member of a high magnetic permeability which is located between the top wall of the specimen chamber and the column, whereby the magnetic flux passed through the top wall enters the annular member and does not affect the electron beam.

Other objects and features of the invention will appear in the course of the description thereof which follows.

DESCRIPTION OF THE PREFERRED EMBODIMENTS

Figure 1:
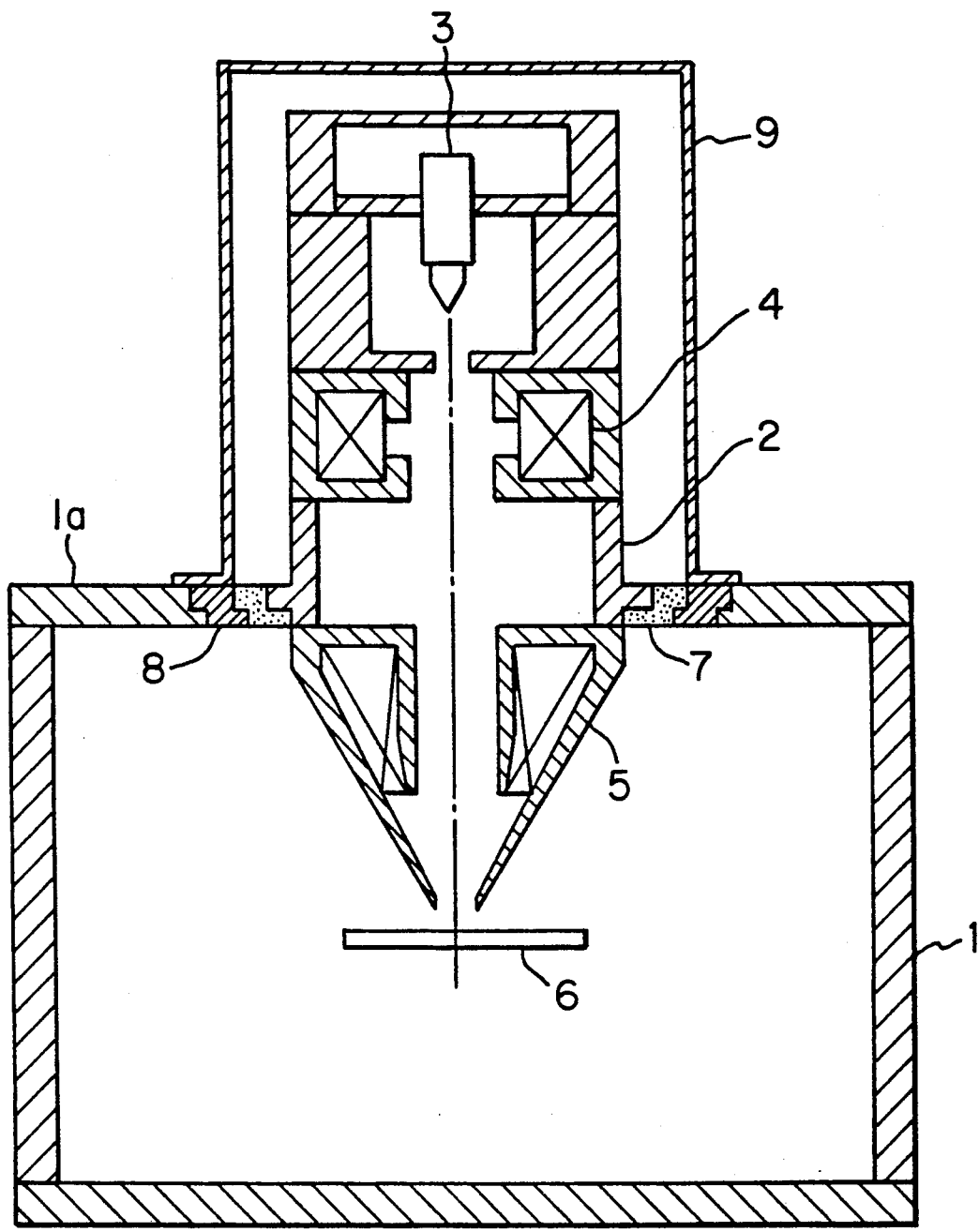
FIG. 1 is a schematic vertical cross section of an electron beam instrument according to the invention.

Referring to FIG. 1, an electron beam instrument embodying the concept of the present invention is schematically shown. The instrument has a specimen chamber 1 and an electron beam column 2 mounted in the chamber 1. An electron gun 3 is mounted at the top of the column 2. The electron beam emitted by the electron gun 3 is finely focused onto a specimen 6 inside the specimen chamber 1 by condenser lenses 4 and objective lenses 5. The position on the specimen 6 hit by the electron beam varies according to the signals supplied to deflection coils (not shown). Scanning signals are supplied to the deflection coils from a scanning signal generator circuit (not shown). Irradiation of the electron beam to the specimen 6 produces secondary electrons, which are detected by a secondary electron detector (not shown). The output signal from this detector is fed to a cathode-ray tube or the like to which the scanning signals are also supplied.

A nonmagnetic member (or low magnetic permeability member) 7 such as brass is mounted at the location at which the column 2 is connected with the specimen chamber to shield the column 2 from the magnetic flux path. An annular member 8 of a highly magnetically permeable material such as permalloy or Mumetal is mounted outside the nonmagnetic member 7. The annular member 8 of high magnetic permeability surrounds the column 2. A shield cover 9 made of a high magnetic permeability is mounted so as to cover the column 2. The bottom of the cover 9 is coupled to the annular member 8 of high permeability.

The electron beam instrument constructed as described above operates in the manner described now. The electron beam is finely focused onto the specimen 6 as described above. This beam is scanned in response to the scanning signals supplied to the deflection coils (not shown). In response to this scan, secondary electrons are produced from the specimen 6 and detected by the secondary electron detector. The output signal from the detector is fed to the cathode-ray tube which operates in synchronism with the scan. In this way, a secondary electron image of the specimen is obtained. When an external magnetic field is applied to the specimen chamber 1, the magnetic flux penetrates the wall of the specimen chamber 1. The magnetic flux transmitted through the top wall 1a of the chamber 1 enters the annular member 8 of high magnetic permeability at a location close to the column 2, penetrates this annular member 8, and again enters the top wall 1a. Then, the magnetic flux leaks out of the specimen chamber through the edges located outside the chamber. Therefore, the magnetic flux leaking into the column at the location of the top wall 1a of the chamber at which the chamber is connected with the column is extremely small. Thus, the electron beam is prevented from being deflected inadequately by the leaking magnetic flux. As a result, a distortionless image which is unaffected by the magnetic field can be displayed. Entry of the magnetic flux into the column 2 can be more perfectly prevented because the nonmagnetic member 7 made of brass or the like is mounted between the highly magnetically permeable annular member 8 and the column 2 to shield the column 2 against the magnetic flux path. Furthermore, the shield cover 9 mounted outside the column prevents the external magnetic field from entering the column.

Figure 2:
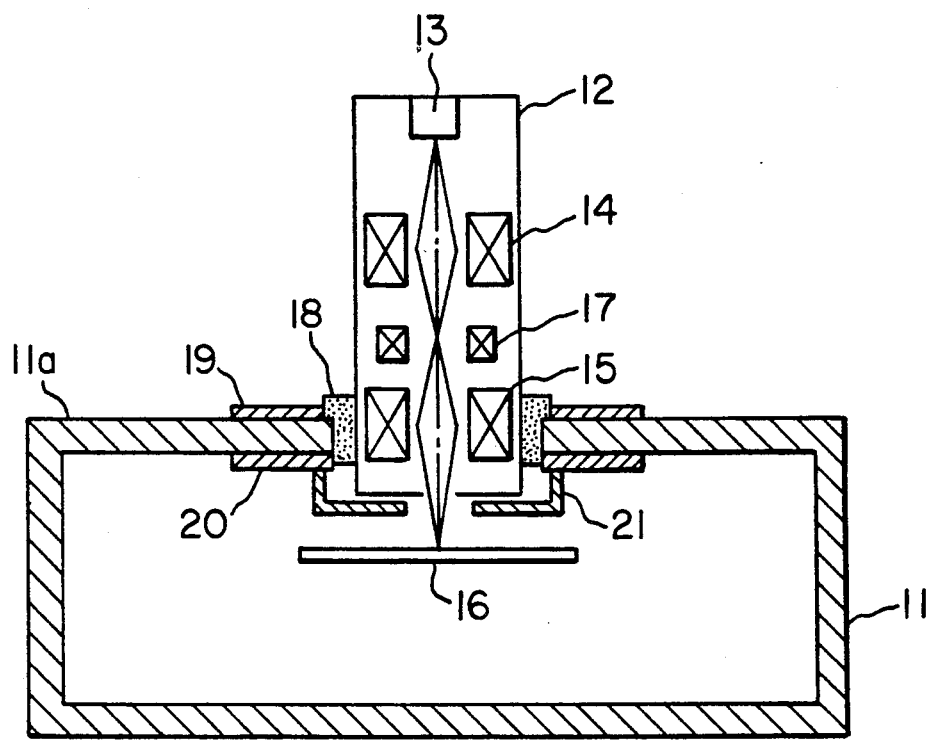
FIG. 2 is a schematic vertical cross section of another electron beam instrument according to the invention.
Figure 3:
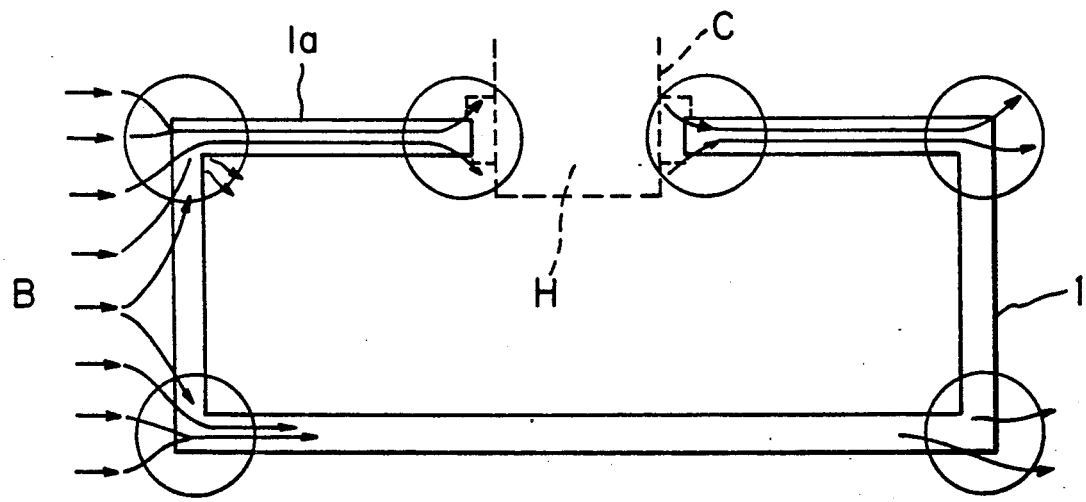
FIG. 3 is a vertical cross section of the specimen chamber of the prior art electron beam instrument.

Referring to FIG. 2, there is shown another electron beam instrument according to the invention. This instrument has a specimen chamber 11 in which an electron beam column 12 is mounted. An electron gun 13 producing an electron beam is mounted at the top of the column 12. The beam from the gun 13 is sharply focused onto a specimen 16 inside the chamber 11 by condenser lenses 14 and objective lenses 15. The position on the specimen 16 hit by the beam is varied in response to signals supplied to deflection coils 17. Scanning signals are supplied to the deflection coils 17 from a scanning signal generator circuit (not shown). The irradiation of the electron beam to the specimen 16 results in secondary electrons, which are detected by a secondary electron detector (not shown). The output signal from the detector is fed to a cathode-ray tube or the like to which the scanning signals are supplied. A shield cover 21 is mounted to a disk 20 (described later) so as to surround the portion of the column 12 which is inserted in the specimen chamber 11.

A nonmagnetic member 18 made of brass or the like is mounted at the location at which the specimen chamber 11 is connected with the column 12 to shield the column 12 against the magnetic flux path. Disks 19 and 20 which are made of a high magnetic permeability such as permalloy or Mumetal are in intimate contact with the upper surface and the lower surface, respectively, of the top wall 11a of the chamber 11 near the column 12. The shield cover 21 made of a material of a high magnetic permeability such as permalloy is mounted below objective lenses 15.

The electron beam instrument built in this way operates in the manner described now. The electron beam is sharply focused onto the specimen 16 as mentioned previously. The beam is scanned in response to the scanning signals supplied to the deflection coils 17 so that secondary electrons are produced from the specimen 16. These secondary electrons are detected by the detector (not shown). The output signal from the detector is applied to the cathode-ray tube that operates in synchronism with the scan. As a result, a secondary electron image of the specimen is derived. When an external magnetic field is applied to the specimen chamber 11, the magnetic flux penetrates the wall of the chamber 11. The magnetic flux passed through the top wall 11a of the chamber 11 is guided into the disks 19 and 20 which are attached to the upper surface and the lower surface, respectively, of the top wall 11a at a location close to the column 12. Then, the flux passes through the disks and reenters the top wall 11a. Finally, the flux leaks out of the specimen chamber through the edges of the chamber. In consequence, the magnetic flux leaking at the location at which the column is connected with the top wall 11a of the specimen chamber is extremely small. In this manner, the beam is prevented from being deflected inappropriately by the leaking flux. If a slight amount of magnetic flux leaks at the location at which the column is connected with the specimen chamber, this leaking flux enters the shield cover 21 located below the objective lenses 15 and so the leaking flux does not affect the electron beam path. Consequently, the effects of the leaking magnetic flux on the electron beam can be eliminated more fully.

While the preferred embodiments of the invention have been described, the invention is not limited to these embodiments. The invention is also applicable to other electron beam instruments such as an electron beam lithography system.

In the novel electron beam instrument, leakage of magnetic flux into the specimen chamber can be prevented without the need to surround the whole specimen chamber by a highly magnetically permeable member. Hence, the invention offers a compact electron beam instrument which can be economically fabricated and prevent the electron beam from being deflected undesirably by disturbing magnetic fields.

Steels have magnetic permeabilities of several thousand Gauss/Oersted. High magnetic permeability materials such as permalloy and Mumetal have magnetic permeabilities in excess of 50,000 Gauss/Oersted. Low permeability materials have magnetic permeabilities less than 500 Gauss/Oersted.

Having thus described our invention with the detail and particularity required by the Patent Laws, what is desired and claimed to be protected by Letters Patent is set forth in the following claims.

What is claimed is:

1. An electron beam instrument having an electron beam source, a condenser lens for focusing the electron beam emitted from the electron beam source, a column that houses both beam source and condenser lens, and a specimen chamber having a top wall through which the column is inserted into the specimen chamber, an annular member of a high magnetic permeability that surrounds the column and is located between both the side surfaces of the top wall and the column, and a nonmagnetic member interposed between said annular member of a high magnetic permeability and said side surface of the column.

2. The electron beam instrument of claim 1, wherein said column is covered with a shield cover whose upper end is connected with said annular member of a high magnetic permeability.

3. An electron beam instrument having an electron beam source, a condenser lens for focusing the electron beam emitted from the electron beam source, a column that houses both beam source and condenser lens, and a specimen chamber having a top wall through which the column is inserted into the specimen chamber, annular members of a high magnetic permeability that surround the column and are in intimate contact with the top wall of the specimen chamber at the location at which the top wall is connected with the column, and a nonmagnetic member which is interposed between both the side surfaces of the top wall and the column.

4. The electron beam instrument of claim 3, wherein said annular members of a high magnetic permeability comprise disks mounted on the upper surface and the lower surface, respectively, of said top wall.

5. The electron beam instrument of claim 5, wherein the disk mounted on the lower surface of said top wall is provided with a shield cover which surrounds the front end of the column inserted in the specimen chamber.

* * * * *